United States Patent
Inada et al.

(10) Patent No.: US 9,885,558 B2
(45) Date of Patent: *Feb. 6, 2018

(54) INTERFEROMETRIC APPARATUS FOR DETECTING 3D POSITION OF A DIFFRACTING OBJECT

(71) Applicant: Nikon Corporation, Chiyoda-ku (JP)

(72) Inventors: Keiji Inada, Chiyoda-ku (JP); Mikihiko Ishii, Kounosu (JP); Tetsuya Koike, Yamoto (JP)

(73) Assignee: Nikon Corporation, Tokyo (JP)

( * ) Notice: Subject to any disclaimer, the term of this patent is extended or adjusted under 35 U.S.C. 154(b) by 545 days.

This patent is subject to a terminal disclaimer.

(21) Appl. No.: 13/791,465

(22) Filed: Mar. 8, 2013

(65) Prior Publication Data

US 2013/0188197 A1    Jul. 25, 2013

Related U.S. Application Data

(62) Division of application No. 12/715,227, filed on Mar. 1, 2010, now Pat. No. 8,416,423.

(30) Foreign Application Priority Data

Aug. 28, 2007 (JP) ................................. 2007-220552
Aug. 26, 2008 (WO) .................. PCT/JP2008/065185

(51) Int. Cl.
    *G01B 9/02*   (2006.01)
    *G03F 7/20*   (2006.01)

(52) U.S. Cl.
    CPC ..... *G01B 9/02041* (2013.01); *G03F 7/70775* (2013.01)

(58) Field of Classification Search
    CPC .................. G01B 9/02041; G03F 7/70775
    (Continued)

(56) References Cited

U.S. PATENT DOCUMENTS 4,360,273 A    11/1982    Thaxter
5,783,833 A    7/1998    Sugaya et al.
(Continued)

FOREIGN PATENT DOCUMENTS

JP    63-229309       9/1988
JP    H01-180403 A    7/1989
(Continued)

OTHER PUBLICATIONS

International Search Report from corresponding International Application No. PCT/JP2008/065185, dated Dec. 9, 2008.
(Continued)

*Primary Examiner* — Hwa Lee
(74) *Attorney, Agent, or Firm* — Klarquist Sparkman, LLP

(57) ABSTRACT

A position detecting apparatus includes a light source, which supplies a detecting light; a light-collecting optical system which collects the detecting light onto a diffracted light generating portion provided on the object; a light guiding optical system which guides, to a predetermined position, a diffracted measuring light generated from the diffracted light generating portion by receiving the detecting light and a reference light generated from a reference surface by receiving the detecting light; and a photodetector which is arranged at the predetermined position and which detects interference fringes generated by the diffracted measuring light and the reference light. Three-dimensional positional information of, for example, a mask pattern surface or an exposure surface of a photosensitive substrate can be highly accurately detected by a relatively simple construction.

21 Claims, 13 Drawing Sheets

(58) Field of Classification Search
USPC ........ 356/499, 488, 494, 500, 508–509, 521
See application file for complete search history.

(56) References Cited

U.S. PATENT DOCUMENTS

| | | | |
|---|---|---|---|
| 6,262,796 | B1 | 7/2001 | Loopstra et al. |
| 6,298,407 | B1 | 10/2001 | Davis et al. |
| 6,341,007 | B1 | 1/2002 | Nishi et al. |
| 6,400,441 | B1 | 6/2002 | Nishi et al. |
| 6,469,793 | B1 * | 10/2002 | Stanton ............... G03F 9/70 356/494 |
| 6,549,269 | B1 | 4/2003 | Nishi et al. |
| 6,590,634 | B1 | 7/2003 | Nishi et al. |
| 7,023,610 | B2 | 4/2006 | Ohtsuki et al. |
| 7,719,691 | B2 | 5/2010 | Ge |
| 2003/0160964 | A1 * | 8/2003 | Dallas ............... G02B 6/4227 356/496 |
| 2004/0189999 | A1 * | 9/2004 | De Groot ........ G01B 11/0675 356/497 |

FOREIGN PATENT DOCUMENTS

| | | |
|---|---|---|
| JP | 03-057905 | 3/1991 |
| JP | 06-295855 | 10/1994 |
| JP | 08-213300 | 8/1996 |
| JP | 2001-174249 A | 6/2001 |
| JP | 2006-023279 A | 1/2006 |
| JP | 2006-284233 A | 10/2006 |

OTHER PUBLICATIONS

Notice of Reasons for Rejection for related Japan Patent Application No. 2008-217457, dated Oct. 25, 2012, 8 pages.
Notice of Allowance for related U.S. Appl. No. 12/715,227, 7 pages, dated Aug. 14, 2012.
Notice of Allowance for related U.S. Appl. No. 12/715,227, 7 pages, dated Dec. 13, 2012.
Office Action for related U.S. Appl. No. 12/715,227, 18 pages, dated Jan. 23, 2012.
Restriction Requirement for related U.S. Appl. No. 12/715,227, 7 pages, dated Nov. 22, 2011.
Written Opinion from International Application No. PCT/JP2008/065185, dated Dec. 9, 2008, 8 pages (with English translation).

* cited by examiner

Fig. 3
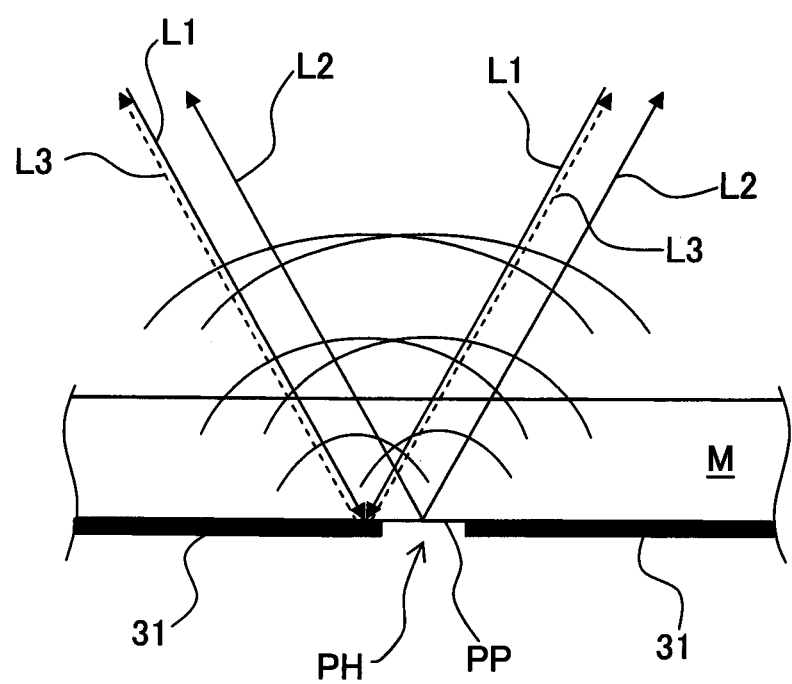
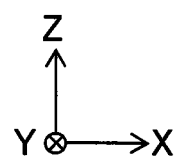

INTERFEROMETRIC APPARATUS FOR DETECTING 3D POSITION OF A DIFFRACTING OBJECT

CROSS-REFERENCES TO RELATED APPLICATIONS

This application is a divisional application of U.S. patent application Ser. No. 12/715,227, filed on Mar. 1, 2010, which is a continuation of International Application No. PCT/JP2008/065185, filed on Aug. 26, 2008, and which claims priority to Japan Patent Application No. 2007-220552, filed on Aug. 28, 2007, all of which being incorporated herein by reference in their respective entireties.

BACKGROUND OF THE INVENTION

Field of the Invention

The present invention relates to a position detecting apparatus, a position detecting method, an exposure apparatus, and a method for producing a device. In particular, the present invention relates to the position detection for a mask or a photosensitive substrate in an exposure apparatus which is usable in the lithography step of producing an electronic device including semiconductor elements, image pickup elements, liquid crystal display elements, thin film magnetic heads, etc.

Description of the Related Art

When a device such as a semiconductor element or the like is produced, a plurality of layers of circuit patterns are formed in an overlapped or overlaid manner on a photosensitive substrate (substrate such as a wafer, a glass plate or the like coated with a photosensitive material). Therefore, in order to perform the relative positional adjustment (alignment) for a pattern of a mask and each of exposure areas of the photosensitive substrate having been already formed with a circuit pattern or patterns in an exposure apparatus for exposing the photosensitive substrate with the circuit patterns, it is necessary to detect the two-dimensional position information taken along a pattern surface of the mask and the two-dimensional position information taken along an exposure surface of the photosensitive substrate. For example, a position detecting apparatus based on the image pickup system has been hitherto suggested in order to detect the two-dimensional position information about the pattern surface of the mask or the exposure surface of the photosensitive substrate. In U.S. Pat. No. 5,783,833, for example, an image pickup element, which is constructed of a CCD camera, is used as an alignment sensor of the off-axis system in order to positionally adjust (align) the mask pattern and the photosensitive substrate. A part of the imaging light flux is received by the image pickup element via a light flux semi-shielding plate.

On the other hand, in order to form a good image (fair image) of a fine pattern of a mask on a photosensitive substrate via a projection optical system, it is necessary for the exposure apparatus to detect the focus position information of the pattern surface of the mask and the focus position information of the exposure surface of the photosensitive substrate taken in the optical axis direction of the projection optical system. In order to detect the focus position information of the pattern surface of the mask or the exposure surface of the photosensitive substrate, for example, a position detecting apparatus of the photoelectric microscope system has been hitherto suggested.

SUMMARY OF THE INVENTION

The position detecting apparatus, of the image pickup system for detecting the two-dimensional position information about the pattern surface of the mask or the exposure surface of the photosensitive substrate, is constructed completely differently from the position detecting apparatus of the photoelectric microscope system for detecting the focus position information about the pattern surface of the mask or the exposure surface of the photosensitive substrate. In other words, in the conventional technique, it has been impossible to highly accurately detect the three-dimensional position information about the pattern surface of the mask or the exposure surface of the photosensitive substrate by using a single unit of any position detecting apparatus.

The present invention has been made taking the foregoing problem into consideration, an object of which is to provide a position detecting apparatus and a position detecting method which make it possible to highly accurately detect, for example, the three-dimensional position information about a pattern surface of a mask or an exposure surface of a photosensitive substrate in accordance with a relatively simple construction or structure. Another object of the present invention is to provide an exposure apparatus which makes it possible to highly accurately perform the positional adjustment for a pattern surface of a mask and an exposure surface of a photosensitive substrate with respect to a projection optical system by using a position detecting apparatus which highly accurately detects the three-dimensional position information about the pattern surface of the mask or the exposure surface of the photosensitive substrate.

According to a first aspect of the present invention, there is provided a position detecting apparatus which detects a position of an object, the position detecting apparatus comprising: a light source which supplies a detecting light; a light-collecting optical system which collects the detecting light onto a diffracted light generating portion provided on the object; a light guiding optical system which guides, to a predetermined position, a diffracted measuring light generated from the diffracted light generating portion by receiving the detecting light and a reference light generated from a reference surface by receiving the detecting light; and a photodetector which is arranged at the predetermined position and which detects interference fringes generated by the diffracted measuring light and the reference light.

According to a second aspect of the present invention, there is provided a position detecting apparatus which detects a position of an object, the position detecting apparatus comprising: a light source which supplies a detecting light; an illumination optical system which illuminates, with the detecting light, a diffracted light generating portion provided on the object; and a photodetector which detects position information of a spherical center of a diffracted light generated from the diffracted light generating portion by receiving the detecting light. The term "spherical center of the diffracted light" refers to the substantial center of the diffracted light generating portion. In a case that the diffracted light (diffracted light beam) generating portion is a pinhole, the spherical center of the diffracted light corresponds to the center of the pinhole. The position information of the spherical center of the diffracted light means information about positional deviation of the spherical center of the diffracted light.

According to a third aspect of the present invention, there is provided a position detecting method for detecting a position of an object, the position detecting method comprising: collecting a detecting light onto a diffracted light generating portion provided on the object; detecting interference fringes generated by a diffracted measuring light generated from the diffracted light generating portion by receiving the detecting light and a reference light generated from a reference surface by receiving the detecting light; and determining three-dimensional position information of the diffracted light generating portion based on the interference fringes.

According to a fourth aspect of the present invention, there is provided a position detecting method for detecting a position of an object, the position detecting method comprising: illuminating a diffracted light generating portion, which is provided on the object, with a detecting light; detecting position information of a spherical center of a diffracted light generated from the diffracted light generating portion by receiving the detecting light; and determining three-dimensional position information of the diffracted light generating portion based on the position information of the spherical center of the diffracted light.

According to a fifth aspect of the present invention, there is provided a position detecting apparatus which detects a position of an object, the position detecting apparatus comprising: a light splitter which splits a light from a light source into a measuring light directed to the object and a reference light; an interference optical system which causes interference between the reference light and a diffracted light generated from the measuring light irradiated onto a diffracted light generating portion provided on the object; and a photodetector which detects interference fringes generated by the interference between the diffracted light and the reference light. The interference optical system may have a first reflecting mirror and a second reflecting mirror which cause the diffracted light and the reference light to be reflected onto a same optical path. A driving element, which moves the second reflecting mirror, may be provided on the second reflecting mirror. The first reflecting mirror may be provided on the light splitter. The diffracted light generating portion may be a pinhole.

According to a sixth aspect of the present invention, there is provided a position detecting method for detecting a position of an object, the position detecting method comprising: splitting a light from a light source into a measuring light and a reference light; generating a diffracted light by irradiating, with the measuring light, a diffracted light generating portion provided on the object; causing interference between the diffracted light and the reference light; and obtaining three-dimensional information of the object by detecting interference fringes generated by the interference between the diffracted light and the reference light.

According to a seventh aspect of the present invention, there is provided an exposure apparatus which exposes a photosensitive substrate with a predetermined pattern via a projection optical system, the exposure apparatus comprising: the position detecting apparatus of the first aspect or the second aspect which detects, as the position of the object, a position of a surface of the predetermined pattern or an exposure surface of the photosensitive substrate; and an alignment apparatus which aligns the surface of the predetermined pattern or the exposure surface of the photosensitive substrate with respect to the projection optical system based on a detection result of the position detecting apparatus.

According to an eighth aspect of the present invention, there is provided a method for producing a device, comprising: an exposure step of exposing the photosensitive substrate with the predetermined pattern by using the exposure apparatus of the seventh aspect; and a development step of developing the photosensitive substrate exposed in the exposure step.

In the position detecting apparatus and the position detecting method of the present invention, the detecting light (detecting light beam) is collected onto the diffracted light generating portion provided, for example, on the pattern surface of the mask or the exposure surface of the photosensitive substrate to detect the interference fringes formed by the diffracted measuring light (diffracted measuring light beam) generated from the diffracted light generating portion and the reference light (reference light beam) generated from the reference surface. The two-dimensional position information of the pattern surface of the mask or the exposure surface of the photosensitive substrate is detected based on tilt components of the interference fringes obtained by analyzing the detected interference fringes. The focus position information of the pattern surface of the mask or the exposure surface of the photosensitive substrate is detected based on the focus components of the interference fringes.

As a result, in the position detecting apparatus and the position detecting method of the present invention, for example, the three-dimensional position information of the pattern surface of the mask or the exposure surface of the photosensitive substrate can be detected highly accurately in accordance with the relatively simple construction. In the exposure apparatus of the present invention, the pattern surface of the mask and the exposure surface of the photosensitive substrate can be subjected to the positional adjustment (alignment) highly accurately with respect to the projection optical system by using the position detecting apparatus which detects the three-dimensional position information of the pattern surface of the mask or the exposure surface of the photosensitive substrate highly accurately. Consequently, it is possible to produce the electronic device highly accurately.

BRIEF DESCRIPTION OF THE DRAWINGS

FIG. 3 shows a situation in which a pinhole is formed as a minute light-transmitting portion surrounded by a light-reflecting area on a pattern surface of a mask.

DESCRIPTION OF THE PREFERRED EMBODIMENTS

Figure 1:
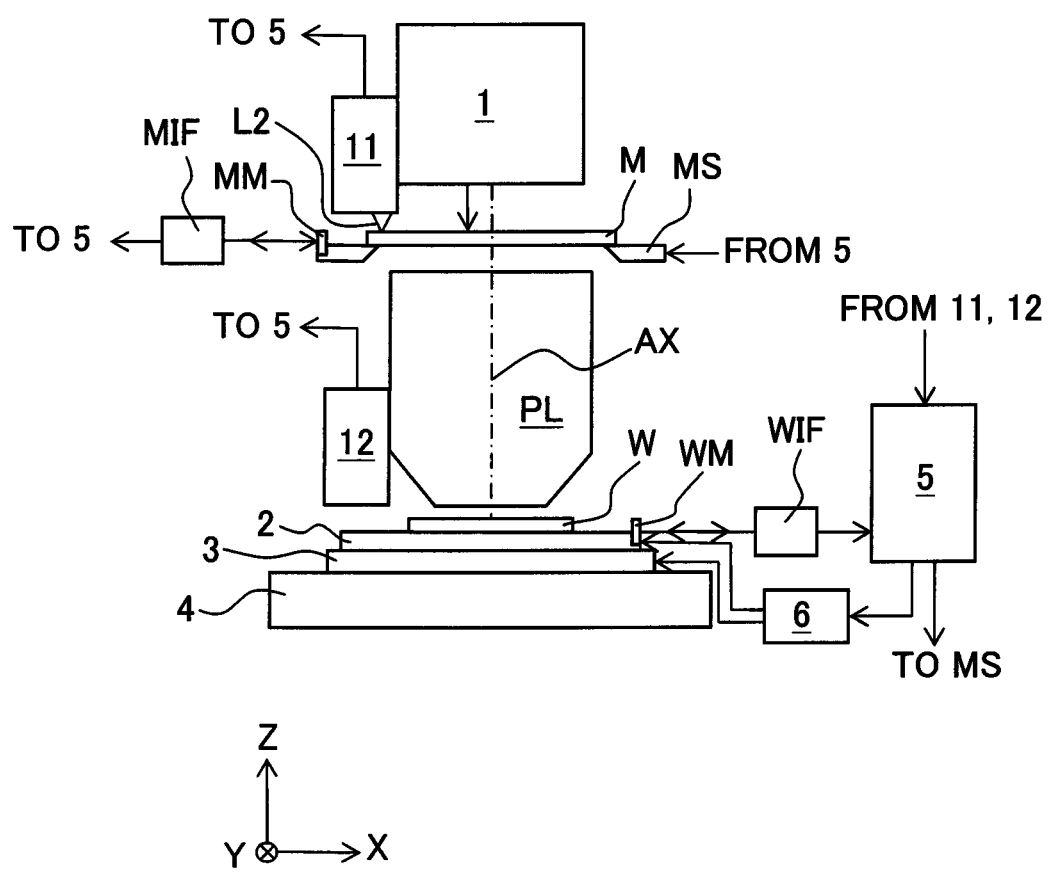
FIG. 1 schematically shows a construction of an exposure apparatus according to an embodiment of the present invention.

An embodiment of the present invention will be explained based on the attached drawings. FIG. 1 schematically shows a construction of an exposure apparatus according to the embodiment of the present invention. In FIG. 1, the X axis and the Y axis are set so that the X axis and the Y axis are perpendicular to each other in a plane parallel to a surface (exposure surface) of a wafer W, and the Z axis is set in the normal line direction of the surface of the wafer W. More specifically, the XY plane is set horizontally, and the +Z axis is set upwardly in the vertical direction.

As shown in FIG. 1, the exposure apparatus of this embodiment includes an illumination system 1 which includes, for example, an ArF excimer laser light source as an exposure light source and which is constructed of an optical integrator (homogenizer), a field diaphragm, a condenser lens, etc. The illumination system 1 illuminates a mask (reticle) M on which a pattern to be transferred is formed, with an exposure light (exposure light beam) radiated from the light source. The illumination system 1 illuminates, for example, an entire pattern area having a rectangular shape of the mask M or a slit-shaped area which is included in the entire pattern area and which is long in the X direction (for example, a rectangular area).

The light (light beam), which is transmitted through the mask M forms, via a projection optical system PL having a predetermined reduction magnification, an image of the pattern (pattern image) of the mask M in a unit exposure area of the wafer (photosensitive substrate) W coated with a photoresist. That is, the mask pattern image is formed in a rectangular area which is similar to the entire pattern area of the mask M or a rectangular area (still exposure area) which is long in the X direction, in the unit exposure area of the wafer W so that the area optically corresponds to the illumination area on the mask M.

The mask M is held in parallel to the XY plane on a mask stage MS. A mechanism (for example, a linear motor), which finely moves the mask M in the X direction, the Y direction, and the direction of rotation about the Z axis, is incorporated into the mask stage MS. A movement mirror MM is provided on the mask stage MS. A mask laser interferometer MIF, which uses the movement mirror MM, measures, in real-time, a position of the mask stage MS (and consequently the mask M) in the X direction, the Y direction, and the direction of rotation.

The wafer W is held in parallel to the XY plane on a Z stage 2 via a wafer holder (not shown). The Z stage 2 is attached onto an XY stage 3 which is movable along the XY plane parallel to the image plane of the projection optical system PL; and the Z stage 2 adjusts a focus position (position in the Z direction) and an angle of inclination (inclination of the surface of the wafer W with respect to the XY plane) of the wafer W. A movement mirror WM is provided on the Z stage 2. A wafer laser interferometer WIF, which uses the movement mirror WM, measures, in real-time, a position of the Z stage 2 in the X direction, the Y direction, and the direction of rotation about the Z axis. The XY stage 3 is placed on a base 4; and the XY stage 3 adjusts the position of the wafer W in the X direction, the Y direction, and the direction of rotation.

The output of the mask laser interferometer MIF and the output of the wafer laser interferometer WIF are supplied to a main control system 5. The main control system 5 controls the position of the mask M in the X direction, the Y direction, and the direction of rotation based on the measurement result of the mask laser interferometer MIF. That is, the main control system 5 transmits the control signal to the mechanism incorporated into the mask stage MS; and the mechanism finely moves the mask stage MS based on the control signal, to thereby adjust the position of the mask M in the X direction, the Y direction, and the direction of rotation.

The main control system 5 controls the focus position and the angle of inclination of the wafer W in order that the surface of the wafer W is adjusted and matched with respect to the image plane of the projection optical system PL (in order that the surface of the wafer W is coincident with the image plane) in the auto-focus manner and the auto-leveling manner. That is, the main control system 5 transmits the control signal to a wafer stage driving system 6; and the wafer stage driving system 6 drives the Z stage 2 based on the control signal, to thereby adjust the focus position and the angle of inclination of the wafer W.

The main control system 5 controls the position of the wafer W in the X direction, the Y direction, and the direction of rotation based on the measurement result of the wafer laser interferometer WIF. That is, the main control system 5 transmits the control signal to the wafer stage driving system 6; and the wafer stage driving system 6 drives the XY stage 3 based on the control signal, to thereby adjust the position of the wafer W in the X direction, the Y direction, and the direction of rotation.

In the step-and-repeat system, one unit exposure area, which is included in the plurality of unit exposure areas set laterally and longitudinally on the wafer W, is subjected to the full field exposure with the pattern image of the mask M. After that, the main control system 5 transmits the control signal to the wafer stage driving system 6 so that the XY stage 3 is step-moved along the XY plane by the wafer stage driving system 6. Accordingly, another unit exposure area of the wafer W is positioned with respect to the projection optical system PL. In this way, the operation, in which the unit exposure area of the wafer W is subjected to the full field exposure with the pattern image of the mask M, is repeated.

In the step-and-scan system, the main control system 5 transmits the control signal to the mechanism incorporated into the mask stage MS, and the main control system 5 transmits the control signal to the wafer stage driving system 6 so that the mask stage MS and the XY stage 3 are moved at a velocity ratio corresponding to the projection magnification of the projection optical system PL, while one unit exposure area, among the plurality of unit exposure areas, of the wafer W is subjected to the scanning exposure with the pattern image of the mask M. After that, the main control system 5 transmits the control signal to the wafer stage driving system 6 so that the XY stage 3 is step-moved along the XY plane by the wafer stage driving system 6. Accordingly, another unit exposure area of the wafer W is positioned with respect to the projection optical system PL. In this way, the operation, in which the unit exposure area of the wafer W is subjected to the scanning exposure with the pattern image of the mask M, is repeated.

That is, in the step-and-scan system, the mask stage MS and the XY stage 3 as well as the mask M and the wafer W are synchronously moved (subjected to the scanning) in the Y direction which is the short side direction of the still exposure area having the rectangular shape (generally the slit shape), while performing the position control of the mask M and the wafer W by using the wafer stage driving system 6, the wafer laser interferometer WIF, etc. Accordingly, the area, which has the width equal to the long side of the still exposure area and which has the length corresponding to the scanning amount (movement amount) of the wafer W, is subjected to the scanning exposure with the mask pattern on the wafer W.

The exposure apparatus of this embodiment is provided with a mask position detecting apparatus 11 which detects the three-dimensional position information (position in the X direction, position in the Y direction, and position in the Z direction) of the pattern surface of the mask M, and a wafer position detecting apparatus 12 which detects the three-dimensional position information (position in the X direction, position in the Y direction, and position in the Z direction) of the exposure surface of the wafer W. The mask position detecting apparatus 11 is attached, for example, to the illumination system 1, and the wafer position detecting apparatus 12 is attached, for example, to the projection optical system PL. The mask position detecting apparatus 11 and the wafer position detecting apparatus 12 are basically constructed identically with each other, and provide mutually identical functions. In the following description, taking notice of the mask position detecting apparatus 11, an explanation will be made about the construction and the function of the position detecting apparatus according to this embodiment.

Figure 2:
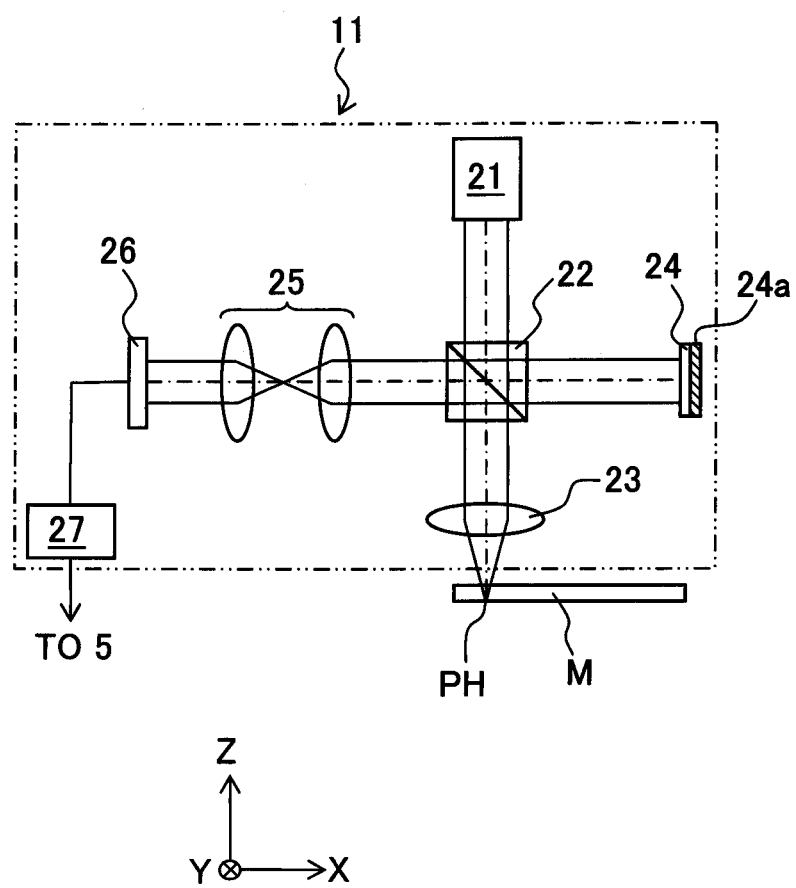
FIG. 2 schematically shows an internal construction of a mask position detecting apparatus shown in FIG. 1.

FIG. 2 schematically shows an internal construction of the mask position detecting apparatus shown in FIG. 1. With reference to FIG. 2, the mask position detecting apparatus 11 of this embodiment principally includes, for example, a He—Ne laser light source 21 which is provided as a light source which supplies a detecting light or detecting light beam (measuring light or measuring light beam), a beam splitter (light splitter) 22 which splits the detecting light into the measuring light and a reference light, a light-collecting lens 23 which collects the measuring light onto a pinhole PH, a reflecting mirror 24 which reflects the reference light, a photodetector 26, a relay lens system 25 which guides the reference light reflected by the reflecting mirror 24 and a diffracted light (measuring light) generated from the pinhole to the photodetector 26, and a signal processing system 27. A driving device 24a such as a PZT element or the like, which drives the reflecting mirror 24 in the XYZ directions, is provided on the reflecting mirror 24. The driving device 24a is controlled by the main control system 5 connected thereto. The detecting light from the light source 21 is converted into a substantially parallel light by an unillustrated collimator lens, and then the detecting light comes into the beam splitter 22. The exposure light, which is taken out from the illumination optical path of the illumination system 1 of the exposure apparatus, can be also used as the detecting light. A part of the detecting light (measuring light), which is allowed to come into the beam splitter 22, is transmitted through the beam splitter 22, and the part of the detecting light forms a spot light in a minute area (for example, a circular area) including the pinhole PH provided on the pattern surface of the mask M, via the light-collecting lens 23. Another part of the detecting light (reference light), which is allowed to come into the beam splitter 22, is reflected by the reflecting surface provided in the beam splitter 22, and the another part of the detecting light is directed to the plane reflecting mirror 24 which has the reflecting surface parallel to the YZ plane.

As shown in FIG. 3, the pinhole PH is formed as a minute light-transmitting portion (for example, a circular area) which is surrounded by a light-reflecting area 31 on a pattern surface PP of the mask M. Specifically, a diameter D of the pinhole PH is designed to be smaller than $\lambda/(2 \times NA)$ provided that $\lambda$ represents the wavelength of the detecting light and NA represents the numerical aperture of the light flux forming the spot light on the pattern surface PP of the mask M (numerical aperture of the light-collecting lens 23) so that the diffracted light, which is generated from the pinhole PH, is substantially a spherical wave. As shown in FIG. 3, a reflected diffracted light L2 is generated from the pinhole PH by receiving the detecting light L1. The diffracted light L2 from the pinhole PH travels as the measuring light and returns to the beam splitter 22 via the light-collecting lens 23, and the diffracted light L2 is reflected toward the relay optical system 25 by the reflecting surface provided in the beam splitter 22.

On the other hand, the another part of the detecting light, which is reflected by the beam splitter 22, is reflected by the reflecting surface (reference surface) of the plane reflecting mirror 24, and the another part of the detecting light returns as the reference light to the beam splitter 22. As described later on, the plane reflecting mirror 24 is finely moved mainly in the optical axis direction (X direction) by the driving device 24a provided on the plane reflecting mirror 24. For example, a corner cube prism can be also used instead of the plane reflecting mirror 24. Also in such a case, it is desirable to provide a driving system for finely moving the reflecting surface. The measuring light reflected by the beam splitter 22 and the reference light transmitted through the beam splitter 22 come, via the relay optical system 25, into the photodetector (area sensor) 26 such as CCD or the like. The reflecting surface provided in the beam splitter 22 and the plane reflecting mirror 24 constitute an interference optical system. The interference fringes, which are formed by the interference between the reference light and the measuring light, are detected by the photodetector 26. When the photodetector 26 detects the interference fringes, then the plane reflecting mirror 24 is moved in the ±X directions by the driving device 24a provided on the plane reflecting mirror 24 under the control of the main control system 5, and thus the phase of the reference light is changed.

The information about the interference fringes detected by the photodetector 26 is supplied to the signal processing system 27. The signal processing system 27 determines the three-dimensional position information of the pinhole PH, i.e., the position in the X direction, the position in the Y direction, and the position in the Z direction of the pinhole PH based on the output of the photodetector 26. Specifically, the signal processing system 27 detects the two-dimensional position information (position in the X direction and position in the Y direction) of the pinhole PH, for example, at a high accuracy of not more than $1/1000$ of the wavelength $\lambda$ of the detecting light based on the tilt components of the interference fringes obtained by the interference fringe analysis. Further, the signal processing system 27 detects the focus position information (position in the Z direction) of the pinhole PH, for example, at a high accuracy of not more than $\frac{1}{1000}$ of the wavelength $\lambda$ of the detecting light based on the focus components of the interference fringes obtained by the interference fringe analysis.

Figure 8:
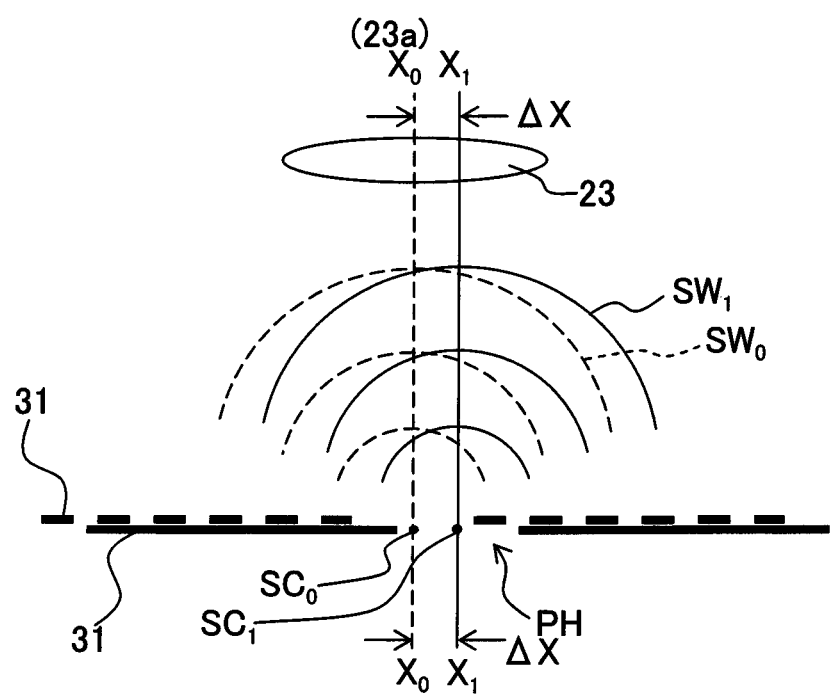
FIG. 8 conceptually illustrates the principle of detection of two-dimensional position information of the pinhole.
Figure 10A:
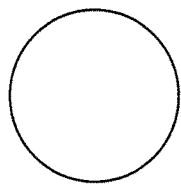
FIG. 10A conceptually shows an interference fringe pattern obtained when the positional deviation of a mask M is absent, FIG. 10B conceptually shows an interference fringe pattern obtained when the positional deviation arises in the X direction of the mask M, and FIG. 10C conceptually shows an interference fringe pattern obtained when the positional deviation arises in the Z direction of the mask M.
Figure 10B:
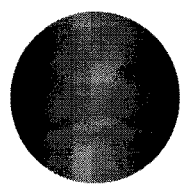
Figure 10C:
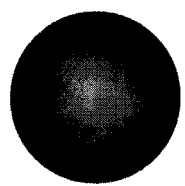

An explanation will be made with reference to FIG. 8 about the principle of the detection of the two-dimensional position information of the pinhole PH. FIG. 8 conceptually shows, by broken lines, the pinhole PH provided when the mask M is positioned at a desired position in the X direction and the Y direction. In this case, the position of the pinhole PH in the X direction (and the Y direction) is coincident with an optical axis 23a of the light-collecting lens 23. A spherical wave $SW_0$, which is represented by broken lines, is generated about the center of a spherical center $SC_0$ thereof from the pinhole PH arranged at the desired position as described above. If the mask M is deviated from the desired position by $\Delta X$ in the X direction, the pinhole PH is also similarly deviated from a position $X_0$ (optical axis 23a of the light-collecting lens 23) to a position $X_1$. A spherical wave $SW_1$, which is generated from the pinhole PH positioned at the position $X_1$, is represented by solid lines in FIG. 8, and the spherical center thereof is represented by $SC_1$. As appreciated from FIG. 8, if the pinhole PH is deviated by $\Delta X$ in the X direction, the spherical center $SC_1$ of the spherical wave $SW_1$ is also deviated by $\Delta X$ from the optical axis 23a of the light-collecting lens 23. As a result, if the spherical wave $SW_1$ is viewed from the center of the light-collecting lens 23, the spherical wave $SW_1$ appears to travel not from the direction of the optical axis 23a but from a direction inclined with respect to the optical axis 23a. In this way, the spherical wave $SW_1$, which comes into the light-collecting lens 23, cannot be a plane wave, in which the phases are uniformized in the plane perpendicular to the optical axis 23a, when the spherical wave $SW_1$ exits from the light-collecting lens 23. That is, the measuring light exiting from the light-collecting lens 23 becomes a plane wave or a spherical wave which has its wavefront not perpendicular to the optical axis 23a. As a result, the measuring light passing through the optical axis of the relay optical system 25 has the phase in the X direction which is different from the phase in the X direction of the measuring light passing through any portion separated in the +Y direction and the −Y direction from the optical axis of the relay optical system 25. If the measuring light as described above causes the interference with the reference light which is reflected from the plane reflecting mirror 24, the interference position differs in the X direction in the measuring light. Therefore, a pattern, in which the brightness and the darkness differ between the center and the both side portions in the Y direction of the spot formed by being irradiated with the measuring light, i.e., the interference fringe appears on the surface of the photodetector 27. FIG. 10 shows examples of the interference fringe patterns detected by the photodetector 27. FIG. 10A shows an interference fringe pattern obtained when the positional deviation of the mask M is absent, in which the entire surface is the brightness pattern. FIG. 10B shows an interference fringe pattern obtained when the positional deviation arises in the X direction of the mask M, in which vertical fringes are observed. Any one of FIGS. 10A to 10C shows the still image observed in accordance with the fringe scan method as described later on.

Figure 9:
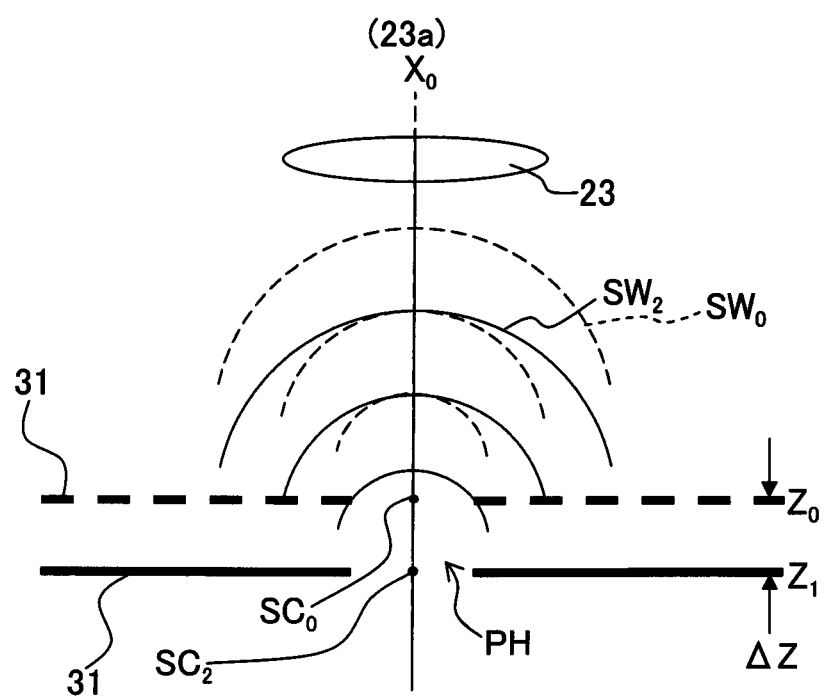
FIG. 9 conceptually illustrates the principle of detection of focus position information of the pinhole.

Next, an explanation will be made with reference to FIG. 9 about the principle of the detection of the focus position information of the pinhole PH. FIG. 9 conceptually illustrates, by broken lines, the principle PH when the mask M is positioned at the desired position in the X direction and the Y direction. In this case, the position of the pinhole PH in the X direction and the Y direction is located on the optical axis 23a of the light-collecting lens 23, and a position $Z_0$ of the pinhole PH in the Z direction is coincident with the desired light-collecting position of the light-collecting lens 23 (just focus position). A spherical wave $SW_0$, which is depicted by broken lines, is generated about the center of a spherical center $SC_0$ thereof from the pinhole PH arranged at the desired position as described above. In this case, the spherical wave $SW_0$ is (becomes) a plane wave when the spherical wave $SW_0$ exits from the light-collecting lens 23; and the phase of the plane wave is coincident with the phase of the reference light at any position in the plane perpendicular to the optical axis. Therefore, the plane wave and the reference light cause the interference with each other. As a result, the bright pattern as shown in FIG. 10A is observed.

If the mask M is deviated by $\Delta Z$ in the −Z direction from the desired position in the Z direction, the pinhole PH is similarly deviated from the position $Z_0$ to a position $Z_1$. A spherical wave $SW_2$, which is generated from the pinhole PH positioned at the position $Z_1$, is represented by solid lines in FIG. 9, and the spherical center thereof is represented by $SC_2$. As appreciated from FIG. 9, if the pinhole PH is deviated by $\Delta Z$ in the Z direction, the spherical center of the spherical wave $SW_1$ is also deviated by $\Delta Z$ in the direction of the optical axis 23a of the light-collecting lens 23. Therefore, the spherical wave $SW_2$ comes into the light-collecting lens 23 at a phase different from that of the spherical wave $SW_0$. That is, when the spherical wave $SW_2$ exits from the light-collecting lens 23, the spherical wave $SW_2$ is a plane wave. However, the plane wave cannot become such a plane wave that all of the in-plane phases are uniformized in relation to the beam passing through the optical axis 23a and those disposed at the outer circumferential portions of the beam; and the phase of the plane wave is not coincident with the phase of the reference light at the in-plane position perpendicular to the optical axis. As a result, the measuring light beam (measuring light), which passes through the optical axis of the relay optical system 25, has the phase in the X direction which is different from the phase in the X direction of the measuring light which passes through the portion (outer circumferential portion) separated from the optical axis of the relay optical system 25. Therefore, the pattern, in which the brightness and the darkness differ between the center and the outer circumferential portion of the spot formed by being irradiated with the measuring light, i.e., the interference fringe appears on the surface of the photodetector 27. FIG. 10C shows the interference fringe pattern detected by the photodetector 27. FIG. 10O also depicts the still image observed in accordance with the fringe scan method.

Figure 12:
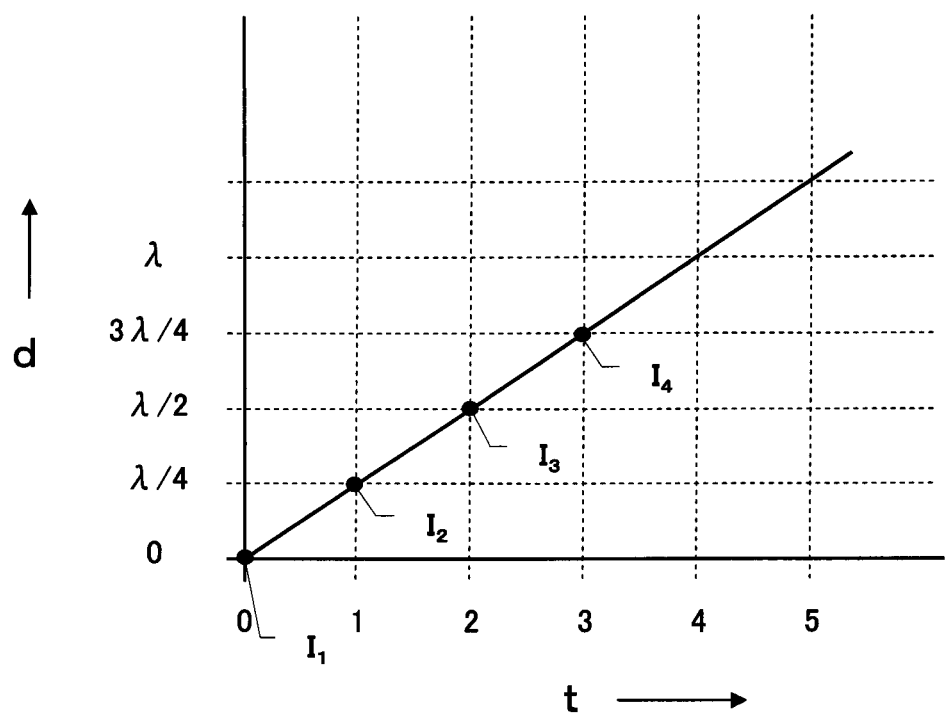
FIG. 12 shows a graph illustrating a timing for incorporating the interference fringe (interference light, interference light beam) into a pixel of CCD constructing a photodetector and a reflecting mirror driving amount brought about by a driving device for a reflecting mirror.
Figure 13A:
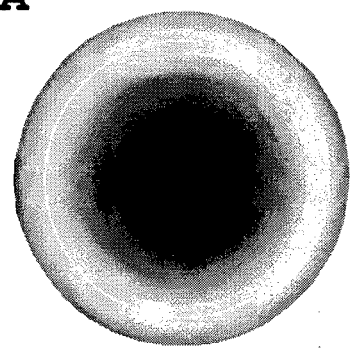
FIGS. 13A to 13D each shows a change of interference fringe pattern detected by the photodetector in accordance with the change of the driving position of the reflecting mirror.
Figure 13B:
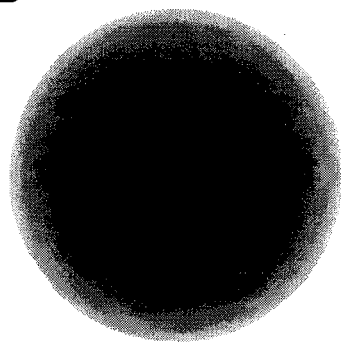
Figure 13C:
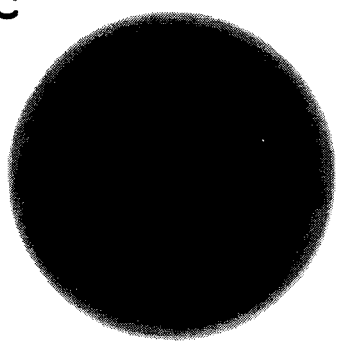
Figure 13D:
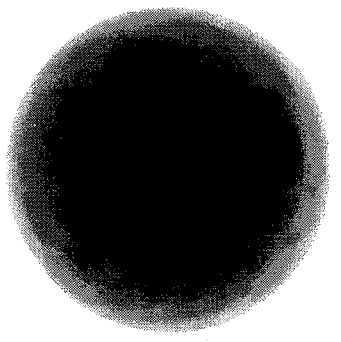

A brief explanation will be made below about the fringe scan method as an example of the interference fringe analysis to be performed by the signal processing system 27. In this method, the information of the interference fringes detected by the photodetector 26 is obtained in synchronization with the phase change of the reference light. The phase of the reference light is changed by driving the driving device (for example, piezoelectric element) 24a of the plane reflecting mirror 24 by the main control system 5 to move the plane reflecting mirror 24 in the optical axis direction. For example, the driving device 24a is driven in accordance with a driving waveform which represents a driving amount (d) with respect to a driving time (t) of the plane reflecting mirror 24 as shown in FIG. 12. FIGS. 13A to 13D show the change of the interference fringe pattern detected by the photodetector 26 when the plane reflecting mirror 24 is moved in the optical axis direction by every ¼ of the detecting light wavelength λ. The data of all pixels of CCD constructing the photodetector 26 is obtained at the point in time at which the plane reflecting mirror 24 is moved in the optical axis direction by every ¼ of the detecting light wavelength λ. The interference fringes detected by the photodetector 26 are supplied to the signal processing system 27. Assuming that $I_1$, $I_2$, $I_3$, $I_4$ represent outputs of a certain pixel at the driving amounts of 0, λ/4, λ/2, 3λ/4, the initial phase of the light coming into the pixel is determined by using the following expression by the signal processing system 27.

$$\Phi_0 = \tan^{-1}(I_2 - I_4)/(I_1 - I_3)$$

The X/Y shift amounts and the focus amount (shift amount in the Z direction) of the pinhole are determined for each of the pixels at a high accuracy of not more than 1/1000 of the detecting light wavelength λ from the initial phase calculated as described above, NA of the light-collecting lens 23, and the detecting light wavelength λ. The interference fringes may be observed and analyzed by using the shearing method in which the reflecting mirror is inclined without moving the reflecting mirror in the optical axis direction, instead of the fringe scan method.

The three-dimensional position information of the pinhole PH detected by the mask position detecting apparatus 11, consequently the three-dimensional position information of the pattern surface of the mask M, is supplied to the main control system 5. Actually, the mask position detecting apparatus 11 independently detects the three-dimensional positions of a plurality of (for example, three) pinholes PH provided on the pattern surface of the mask M. In this way, by detecting the three-dimensional positions of the three or more pinholes PH, the information about the rotation about the X axis and the Y axis of the mask surface can be obtained from the position information of the pinholes PH. The main control system 5 drives the mask stage MS based on the detection result of the mask position detecting apparatus 11, to thereby positionally adjust (align) the pattern surface of the mask M in the X direction, the Y direction, and the direction of rotation with respect to the projection optical system PL. Further, the main control system 5 drives the mask stage MS based on the detection result of the mask position detecting apparatus 11, if necessary, to thereby perform positional adjustment in relation to the leveling and in relation to the Z direction for the pattern surface of the mask M with respect to the projection optical system PL.

Figure 4A:
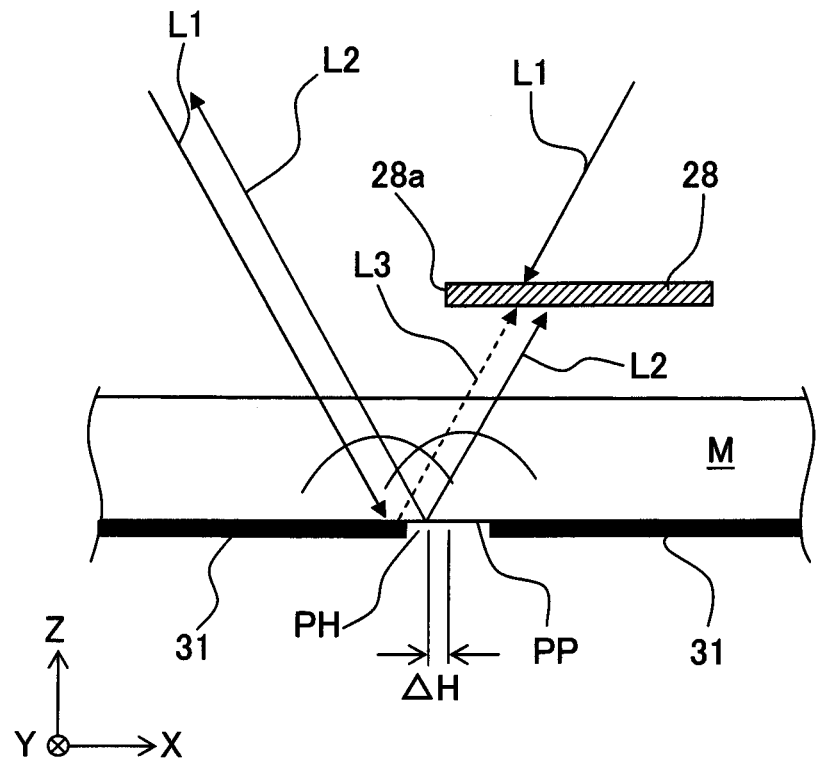
FIG. 4A shows a situation in which a light shielding member is additionally provided in an optical path between a light-collecting lens and the mask.

As shown in FIG. 3, the following situation is assumed for the mask position detecting apparatus 11. That is, a regular reflected light L3, which is generated from the light-reflecting area 31 disposed around the pinhole PH by receiving the detecting light L1, arrives at the photodetector 26, the regular reflected light L3 affects the formation of the interference fringes between the reference light and the measuring light, and the regular reflected light L3 consequently affects the accuracy of the position detection. In such a situation, as shown in FIG. 4A, for example, it is preferable to additionally provide a light shielding plate (light shielding member) 28 in the optical path between the light-collecting lens 23 and the mask M in order that the photodetector 26 is shielded from the arrival of unnecessary light L3 which is generated from the light-reflecting area 31 disposed around the pinhole PH.

Figure 4B:
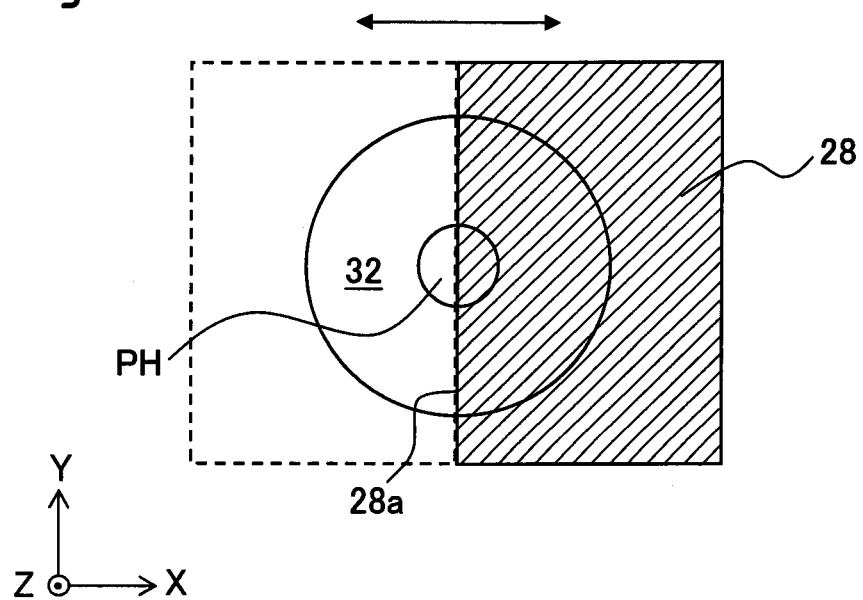
FIG. 4B shows a situation in which the light shielding member is arranged to shield about a half of a detecting light which arrives at the pattern surface of the mask and forms a spot light.

As shown in FIG. 4B, the light shielding plate 28 has, for example, a rectangular form, and the light shielding plate 28 is arranged to shield or intercept about a half of the detecting light L1 which will arrive at the pattern surface of the mask M to form the spot light 32. In this case, a part of the diffracted measuring light L2, which is generated from the pinhole PH, is shielded by the light shielding plate 29. However, it is possible to shield the unnecessary light (regular reflected light) L3 generated from the light-reflecting area 31 disposed around the pinhole PH by the light shielding plate 28. As a result, it is possible perform the position detection highly accurately, without substantially being affected by the unnecessary light L3 which is generated from the surrounding of the pinhole PH by receiving the detecting light L1.

It is preferable that the light shielding plate 28 is arranged at the position optically conjugate with the detection surface of the photodetector 26. Owing to this arrangement, it is possible to avoid the influence, exerted on the formation of the interference fringes between the reference light and the measuring light on the photodetector 26, by the diffracted light generated at an edge 28a of the light shielding plate 28 by receiving the detecting light L1, and it is possible to consequently avoid the influence exerted on the accuracy of the position detection, for the following reason. That is, when the light shielding plate 28 and the detection surface of the photodetector 26 are arranged at the optically conjugate positions, the diffracted light, which is generated at the edge 28a of the light shielding plate 28, is collected again on the detection surface of the photodetector 26. Therefore, any fuzziness (out of focus) does not arise, which would be otherwise caused by the diffracted light.

The spherical center of the diffracted light generated from the pinhole PH is not strictly determined by only the position of the pinhole PH, and is slightly affected by the light-collecting position of the detecting light. For example, as shown in FIG. 4A, in the construction in which about the half of the detecting light L1 coming into the pattern surface of the mask M is shielded by the light shielding plate 28, the axis of the center of gravity of the incident light flux coming into the pattern surface of the mask M is inclined toward the left side (in the −X direction) as viewed in the drawing. Therefore, if the detecting light is defocused, the detecting light is deviated in the X direction with respect to the pinhole PH. As a result, the mask position detecting apparatus 11 erroneously detects, as the center position of the pinhole PH, a position which is moved from the center position of the pinhole PH by ΔH (amount proportional to the deviation of the detecting light in the X direction) toward the left side (in the −X direction) as viewed in the drawing. In order to avoid the erroneous detection, as shown in FIG. 4B, the following procedure may be appropriately adopted. That is, the position of the light shielding plate 28 is switched between a first position (position indicated by solid lines in the drawing) at which the right half of the detecting light L1 which will arrive at the pattern surface of the mask M and form the spot light 32 as viewed in the drawing is shielded and a second position (position indicated by broken lines in the drawing) at which the left half of the detecting light L1 as viewed in the drawing is shielded; and the center position of the pinhole PH is detected, for example, based on the average value of the detection result obtained at the first position and the detection result obtained at the second position.

Figure 5:
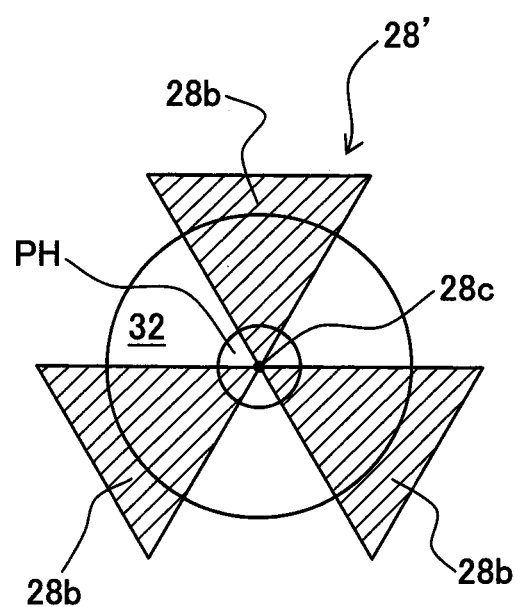
FIG. 5 schematically shows a construction of a light shielding member having a form different from that shown in FIG. 4.

The mask position detecting apparatus 11 described above uses the rectangular light shielding plate 28 in which the position can be switched along one direction. However, the present invention is not limited to this. Various forms are conceivable in relation to the light shielding member which is provided to shield the arrival at the photodetector 26 of the unnecessary light L3 generated from the light-reflecting area 31 disposed around the pinhole PH. For example, as shown in FIG. 5, a light shielding member 28' can be also constructed such that apexes of three triangular light-shielding areas 28b are made to coincide with each other, and the three light-shielding areas 28b are arranged substantially rotationally symmetrically in relation to a position 28c at which the apexes are coincident with each other. The light shielding member 28' is realized, for example, by forming the light-shielding areas 28b on a light-transmissive substrate.

In a case that the light shielding member 28' is used, the erroneous detection of the center position of the pinhole PH, which would be caused by the shield of a part of the detecting light L1 coming into the pattern surface of the mask M, can be suppressed to be small, even when the position is not switched by moving the light shielding member 28', because the three triangular light-shielding areas 28b are arranged substantially rotationally symmetrically in relation to the center position 28c. By performing the position detection while rotating the light shielding member 28' at a high speed about the axis which passes through the center position 28c and which is parallel to the Z axis, it is possible to suppress the erroneous detection of the center position of the pinhole PH to be smaller, and consequently it is possible to perform the position detection more highly accurately. In a case that the light shielding member 28' is used, it is also preferable that the light shielding member 28' is arranged at the position which is optically conjugate with the detection surface of the photodetector 26 in order to avoid the influence exerted on the formation of the interference fringes by the diffracted light generated at the edge of the light-shielding area 28b.

Figure 11A:
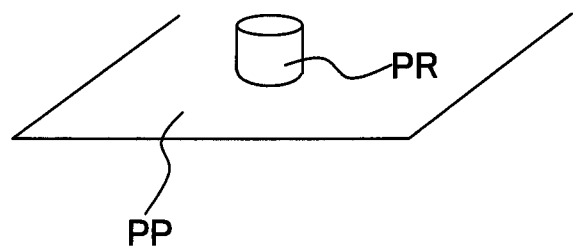
FIG. 11A shows a protrusion having a reflecting surface, instead of the pinhole.
Figure 11B:
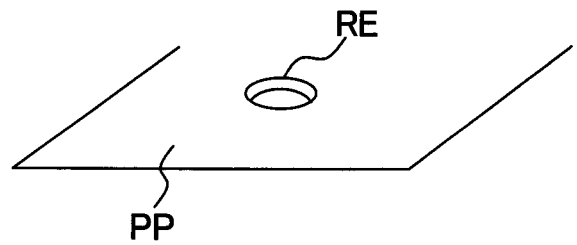
FIG. 11B shows a recess having a reflecting surface, instead of the pinhole.

The mask position detecting apparatus 11 described above uses the pinhole PH which is constructed of a minute light-transmitting portion surrounded by the light-reflecting area 31 on the pattern surface PP of the mask M, as the diffracted light generating portion which generates the diffracted measuring light by receiving the detecting light. However, the present invention is not limited to this. For example, it is also possible to use, as the diffracted light generating portion, a point reflector (pin mirror) which is constructed of a minute light-reflecting portion surrounded by a light-transmitting area on the pattern surface PP of the mask M. Further, for example, it is also possible to use, as the diffracted light generating portion, a protrusion PR which has a reflecting surface (top portion) protruding to the outside of the mask M from a surrounding area as shown in FIG. 11A, or a recess RE which has a reflecting surface (bottom surface) recessed to the inside of the mask M from a surrounding area as shown in FIG. 11B, on the pattern surface PP of the mask M. Further, for example, it is also possible to use, as the diffracted light generating portion, a different reflectance portion (high reflective portion or low reflective portion) which has a reflectance different from that of a surrounding area, on the pattern surface PP of the mask M.

Similarly, also in the wafer position detecting apparatus 13 of this embodiment, the three-dimensional position information (position in the X direction, position in the Y direction, and position in the Z direction) is detected for a plurality of (for example, three) diffracted light generating portions (for example, pinholes, point reflectors, protruding stepped portions, recessed stepped portions, different reflectance portions, etc.) formed on the surface (exposure surface) of the wafer W based on the output of the photodetector 26. Specifically, the signal processing system 27 detects the two-dimensional position information (position in the X direction and position in the Y direction) of the diffracted light generating portions provided on the exposure surface of the wafer W, for example, at a high accuracy of not more than 1/1000 of the wavelength λ of the detecting light based on the tilt components of the interference fringes obtained by the interference fringe analysis.

Further, the focus position information (position in the Z direction) is detected for the diffracted light generating portions provided on the exposure surface of the wafer W, for example, at a high accuracy of not more than 1/1000 of the wavelength λ of the detecting light based on the focus components of the interference fringes obtained by the interference fringe analysis. The main control system 5 drives the Z stage 2 based on the detection result of the wafer position detecting apparatus 12 to thereby perform the positional adjustment for the leveling and in the Z direction of the exposure surface of the wafer W with respect to the projection optical system PL. Further, the main control system 5 drives the XY stage 3 based on the detection result of the wafer position detecting apparatus 12 to thereby perform the positional adjustment of the exposure surface of the wafer W in the X direction, the Y direction, and the direction of rotation with respect to the projection optical system PL.

The mask position detecting apparatus 11 described above uses the photodetector (area sensor) 26 such as CCD or the like as the detector for detecting the interference fringes formed by the interference between the reference light and the measuring light. However, the present invention is not limited to this. For example, a transmitting screen or a reflecting screen can be also used as the detector. In a case that the transmitting screen or the reflecting screen is used, it is possible to detect the three-dimensional position information (position in the X direction, position in the Y direction, and position in the Z direction) of the diffracted light generating portion by observing the interference fringes projected onto the screen.

In the mask position detecting apparatus 11 described above, the information about the interference fringes is detected by the photodetector 26. However, the present invention is not limited to this. The information (position information about the spherical center of the diffracted light), which relates to the spherical center position of the diffracted light generated from the diffracted light generating portion, may be detected by the photodetector 26. That is, the deviation or excursion of the intensity distribution of the diffracted light is detected to make comparison, for example, with the intensity distribution obtained when the just alignment position is provided. Accordingly, the spherical center position can be detected from the positional deviation (lateral deviation) amounts in the X and Y directions and the deviation amount in the Z direction (in the optical axis direction from the just focus position). More specifically, the spherical center position information of the diffracted light can be detected as follows. In a case that the mask M is positioned at a (first) reference position by the mask stage MS, the diffracted light L2 is generated from the hole (or the pin mirror) at the position as shown in FIG. 1. In this procedure, as described above, the interference fringes, which are formed by the diffracted light L2 and the reference light, are measured by the mask position detecting apparatus 11. The measured interference fringes are interference fringes to be observed when the mask M is positioned at the (first) reference position by the mask stage MS; and the position of the mask M is measured by the mask laser interferometer MIF. If the position of the mask M is deviated from the (first) reference position, the interference fringes are observed as described above. The interference fringes include the information about the deviation amount of the spherical center. That is, it is possible to know the positional deviation amount of the spherical center according to the tilt amounts (X/Y shift amounts are calculated from X/Y tilt amounts) and the defocus amount (Z) determined from the interference fringes as described above. The position of the spherical center is obtained by adding the positional deviation amount of the spherical center determined from the interference fringes to the position coordinate of the mask stage MS obtained when the mask M is positioned at the (first) reference position. During the process of the calculation, the shift amounts and the focus amount are multiplied by correction coefficients depending on the measuring wavelength, the size and the depth of the pinhole, and NA of the light-collecting lens which effects radiation (irradiation) onto the pinhole.

As described above, the mask position detecting apparatus 11 of this embodiment can detect the three-dimensional position information of the pattern surface of the mask M highly accurately in accordance with the relatively simple construction. Further, the wafer position detecting apparatus 12 of this embodiment can also detect the three-dimensional position information of the exposure surface of the wafer W highly accurately in accordance with the relatively simple construction. As a result, in the exposure apparatus of this embodiment, the pattern surface of the mask M and the exposure surface of the wafer W can be positionally adjusted (aligned) highly accurately with respect to the projection optical system PL by using the position detecting apparatuses 11, 12 for detecting the three-dimensional position information of the pattern surface of the mask M and the exposure surface of the wafer W highly accurately. Consequently, it is possible to perform the exposure satisfactorily.

In a case that the three-dimensional position information of the exposure surface of the wafer W is detected in accordance with the present invention, alignment marks provided on the respective shot areas defined and comparted on the wafer surface and marks provided outside the shot areas can be formed with the pin mirrors or the protruding patterns as described above. As for such marks, for example, the pinhole pattern of the mask can be transferred to the wafer by exposing the wafer W, which is coated with a photosensitive material, with a pattern of the mask which is formed with the pinholes PH as described in the foregoing embodiment and by performing the development. The alignment mark, which is formed on the wafer W, is usually detected by using an alignment system of the off-axis system or an alignment microscope of the TTL system. However, in the present invention, it is possible to simultaneously detect not only the two-dimensional position information in the X and Y directions but also the position in the Z direction corresponding to the focus information, by using the position detecting system as shown in FIG. 2 as described above. The main control system 5 of the exposure apparatus can positionally adjust the respective shot areas in the X, Y, and Z directions with respect to the pattern of the mask M in a short period of time by controlling the wafer stage driving system 6 in the coordinate system of the wafer laser interferometer WIF by using the position information of the respective shot areas of the wafer W obtained as described above and the distance (baseline) information about the distance between the wafer position detecting apparatus 12 and the projection optical system PL provided with the same.

In the embodiment described above, the mask position detecting apparatus 11 is attached to the illumination system 1, and the wafer position detecting apparatus 12 is attached to the projection optical system PL. However, the present invention is not limited to this. Both of the mask position detecting apparatus 11 and the wafer position detecting apparatus 12 can be attached to the projection optical system PL as well. The mask position detecting apparatus 11 may be arranged separately or away from the illumination system 1, and/or the wafer position detecting apparatus 12 may be arranged separately or away from the projection optical system PL.

In the embodiment described above, the present invention is applied to the mask position detecting apparatus 11 which detects the three-dimensional position information of the pattern surface of the mask M and the wafer position detecting apparatus 12 which detects the three-dimensional position information of the exposure surface of the wafer W in the exposure apparatus. However, the present invention is not limited to this. The position detecting apparatus of the present invention can be also used, for example, when the flatness of the wafer before the exposure is measured on a calibration stage provided distinctly from the wafer stage (2, 3). In this case, the three-dimensional position information is detected for a plurality of (for example, three) diffracted light generating portions formed on the surface of the wafer, and the flatness of the wafer is measured based on the detected position information. Further, in general, the position detecting apparatus of the present invention is applicable to the detection of the three-dimensional position information of any other appropriate object other than the mask and the wafer. For example, the position detecting apparatus of the present invention is also usable for a focus mechanism of a camera and usable for positional adjustment of any sample for a microscope, without being limited to only the exposure apparatus.

In the embodiment described above, the light shielding plate 28 (28') is used to shield the reflected light from the member disposed around the pinhole PH. However, the light shielding plate is not necessarily indispensable in the present invention. In particular, the light shielding plate is unnecessary in a case that the reflectance of the surrounding of the pinhole PH is low and/or in a case that the pin mirror or any protrusion or recess having a reflecting surface having a reflectance higher than that of the surrounding is used. It is not necessarily indispensable that the position detector itself is provided with the signal processing system 27. For example, the control system of the exposure apparatus may perform the signal processing. It is also possible to utilize a computer which is available at the site at which the position detection is performed. In the embodiment described above, the position of the reflecting mirror 24 in the optical axis direction is moved by using the driving device 24a which drives the reflecting mirror. However, the frequency of the light source may be modulated, without using the driving device 24a.

The foregoing embodiment has been explained as exemplified by the exposure apparatus having the structure as shown in FIG. 1 by way of example. However, the present invention is not limited to this, and the present invention is applicable to exposure apparatuses of various types. For example, it is possible to adopt, for example, an exposure apparatus in which two mask patterns are combined on a substrate via a projection optical system and one shot area on the substrate is subjected to the double exposure substantially simultaneously by one time of the scanning exposure as disclosed, for example, in U.S. Pat. No. 6,611,316. It is possible to adopt, for example, an exposure apparatus of the proximity system and a mirror projection aligner as the exposure apparatus. It is also possible to adopt an exposure apparatus of the twin stage type provided with a plurality of substrate stages as disclosed, for example, in U.S. Pat. Nos. 6,341,007, 6,400,441, 6,549,269, 6,590,634, 6,298,407, and 6,262,796. It is possible to adopt an exposure apparatus provided with a plurality of substrate stages and measuring stages. The present invention is also applicable to a liquid immersion type exposure apparatus in which a liquid immersion space is formed between a substrate and a projection optical system and a mask pattern is subjected to the exposure via a liquid supplied to the liquid immersion space. In the liquid immersion exposure apparatus, the mask position and the wafer position can be detected without allowing the liquid to intervene (not via the liquid).

As for the way of use of the exposure apparatus, the present invention is not limited to the exposure apparatus for producing the semiconductor element in which a substrate is exposed with a semiconductor element pattern. The present invention is also widely applicable, for example, to exposure apparatuses for producing a liquid crystal display element or producing a display as well as exposure apparatuses for producing, for example, a thin film magnetic head, an image pickup element (CCD), a micromachine, MEMS, a DNA chip, a reticle, or a mask.

In the respective embodiments described above, the position information of each of the mask stage, the substrate stage, and the measuring stage is measured by using the interferometer system including the laser interferometer. However, the present invention is not limited to this. It is also allowable to use, for example, an encoder system which detects a scale (diffraction grating) provided on each of the stages. In the respective embodiments described above, the ArF excimer laser may be used as the light source device or apparatus which generates the ArF excimer laser beam as the exposure light. However, it is also allowable to use a high harmonic wave generator which includes, for example, a solid laser light source such as a DFB semiconductor laser, a fiber laser or the like, a light-amplifying section having a fiber amplifier or the like, and a wavelength converting section and which outputs the pulse light having a wavelength of 193 nm as disclosed, for example, in U.S. Pat. No. 7,023,610.

With the exposure apparatus of the embodiment described above, an electronic device (a semiconductor element, an image pickup element, a liquid crystal display element, a thin film magnetic head, etc.) can be produced by exposing a photosensitive substrate with a mask pattern by using the projection optical system (exposure step). An explanation will be made below with reference to a flow chart shown in FIG. 6 about an exemplary procedure adopted when the semiconductor device as the electronic device is obtained by forming a predetermined circuit pattern, for example, on a wafer as the photosensitive substrate by using the exposure apparatus of the embodiment of the present invention.

Figure 6:
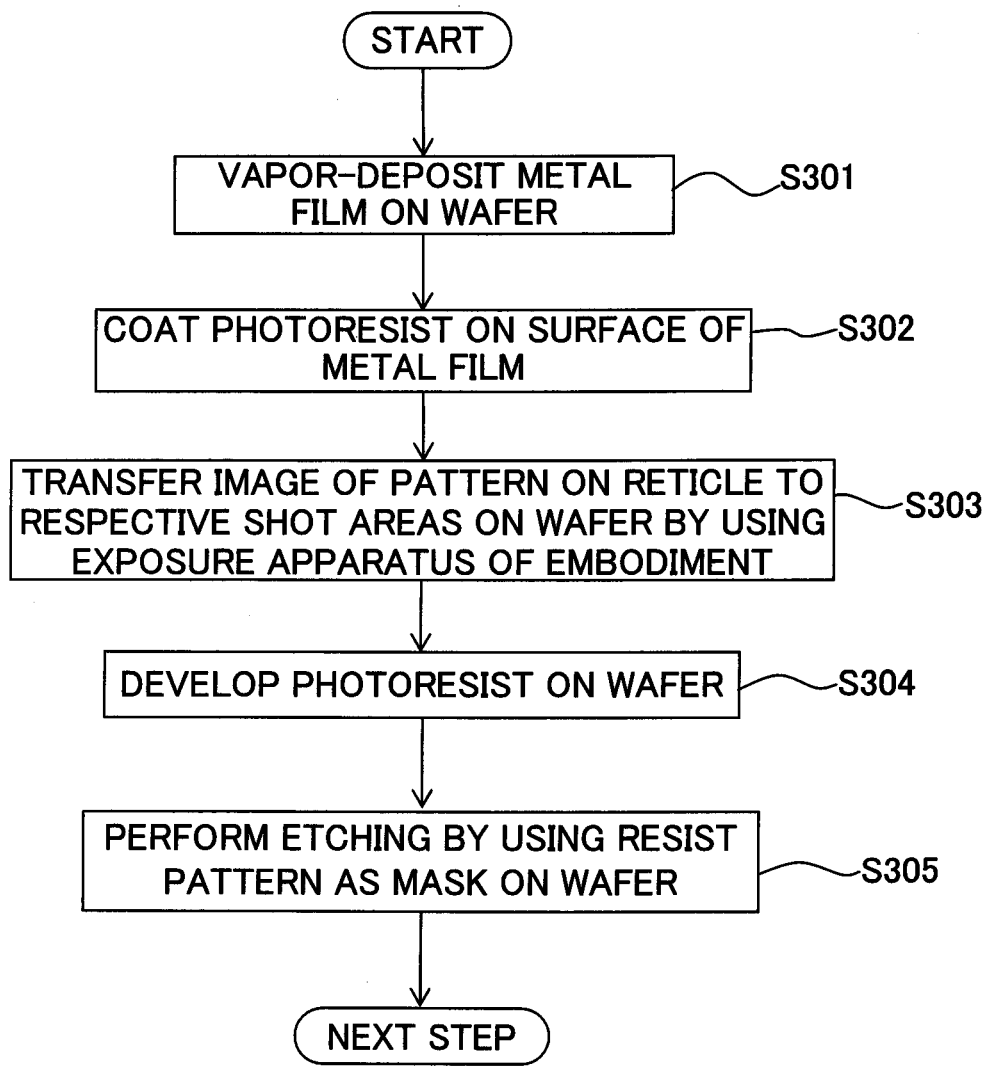
FIG. 6 shows a flow chart illustrating a procedure adopted when a semiconductor device is obtained as an electronic device.

At first, in Step S301 shown in FIG. 6, a metal film is vapor-deposited on each of wafers of 1 lot. Subsequently, in Step S302, a photoresist is coated on a surface of the metal film on each of the wafers of 1 lot. After that, in Step S303, the exposure apparatus of the embodiment of the present invention is used to successively transfer and expose, via the projection optical system, an image of a pattern on the mask to the respective shot areas on each of the wafers of 1 lot. After that, the photoresist on each of the wafers of 1 lot is developed in Step S304, and then the etching is performed by using the resist pattern as a mask on each of the wafers of 1 lot in Step S305. Accordingly, a circuit pattern, which corresponds to the pattern on the mask, is formed on each of the shot areas on each of the wafers.

After that, by forming circuit patterns of upper layers, etc., the device such as the semiconductor element or the like is produced. According to the method for producing the semiconductor device described above, the semiconductor device, which has an extremely fine circuit pattern, can be obtained with a good throughput. In Step S301 to Step S305, the metal is vapor-deposited on the wafer, and the surface of the metal film is coated with the resist to perform the respective steps of the exposure, the development, and the etching. However, it goes without saying that a silicon oxide film may be formed on the wafer prior to these steps, and then the surface of the silicon oxide film may be coated with the resist to perform the respective steps of the exposure, the development, and the etching.

Figure 7:
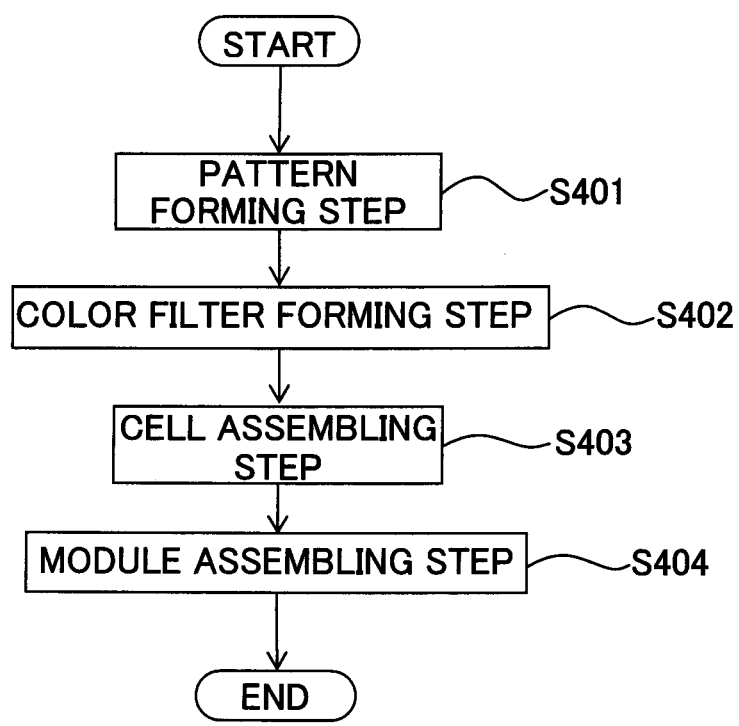
FIG. 7 shows a flow chart illustrating a procedure adopted when a liquid crystal display element is obtained as an electronic device.

With the exposure apparatus of the embodiment of the present invention, it is also possible to obtain a liquid crystal display element as the electronic device by forming a predetermined pattern (a circuit pattern, an electrode pattern, etc.) on a plate (glass substrate). An explanation will be made below with reference to a flow chart shown in FIG. 7 about an exemplary procedure adopted in this process. With reference to FIG. 7, in a pattern forming step 401, a so-called photolithography step is executed, in which a mask pattern is transferred to a photosensitive substrate (for example, a glass substrate coated with a resist) to perform the exposure by using the exposure apparatus of the embodiment of the present invention. The predetermined pattern, which includes a large number of electrodes, etc., is formed on the photosensitive substrate in accordance with the photolithography step. After that, the exposed substrate undergoes the respective steps including a development step, an etching step, a resist exfoliation step, etc., and thus the predetermined pattern is formed on the substrate; and the process next proceeds to a color filter forming step 402.

Next, in the color filter forming step 402, a color filter is formed, in which a large number of sets of three types of dots corresponding to R (Red), G (Green), and B (Blue) are arranged in a matrix form, or a plurality of sets of filters of three types of stripes of R, G, and B are arranged in the horizontal scanning direction. A cell assembling step 403 is executed after the color filter forming step 402. In the cell assembling step 403, a liquid crystal panel (liquid crystal cell) is assembled by using, for example, a substrate having the predetermined pattern obtained in the pattern forming step 401 and the color filter obtained in the color filter forming step 402.

In the cell assembling step 403, for example, the liquid crystal panel (liquid crystal cell) is produced by injecting the liquid crystal into a space between the substrate having the predetermined pattern obtained in the pattern forming step 401 and the color filter obtained in the color filter forming step 402. After that, in a module assembling step 404, respective parts, which include an electric circuit, a backlight, etc. performing the display operation of the assembled liquid crystal panel (liquid crystal cell), are attached, and the liquid crystal display element is completed. According to the method for producing the liquid crystal display element described above, the liquid crystal display element, which has the extremely fine circuit pattern, can be produced at a high throughput.

According to the position detecting apparatus of the present invention, the three-dimensional position information of the objective can be detected highly accurately, although the position detecting apparatus has the relatively simple structure. The exposure apparatus of the present invention uses the position detecting apparatus of the present invention. Therefore, the pattern surface of the mask can be positionally adjusted highly accurately with respect to the exposure surface of the photosensitive substrate, although the alignment system and the focus system has the simple structures. Therefore, according to the method for producing the device of the present invention, it is possible to produce the highly accurate electronic device. Therefore, the present invention will remarkably contribute to the international development of the precision mechanical equipment industry including the semiconductor industry.

What is claimed is:

1. A position detecting apparatus which detects a three-dimensional position of an object, the position detecting apparatus comprising:
    a light source which supplies a detecting light;
    light-collecting optics having at least one optical element which collects the detecting light onto a diffracted light generating portion associated with a position of a surface of a predetermined pattern or an exposure surface of a photosensitive substrate, the diffracted light generating portion including at least one hole, an uneven surface area, or a reflective surface;
    a reference surface defined by a plane mirror or a corner cube prism;
    light guiding optics having at least one optical element which guides, to a predetermined position, a diffracted measuring light generated from the diffracted light generating portion by receiving the detecting light and a collimated reference light generated from the reference surface by receiving the detecting light;
    a photodetector which is arranged at the predetermined position and which detects interference fringes generated by the diffracted measuring light and the collimated reference light;
    an interference fringe analyzer coupled to the photodetector so as to detect, as the three-dimensional position of the object, a three-dimensional position of the surface of the predetermined pattern or the exposure surface of the photosensitive substrate; and
    a stage which aligns the surface of the predetermined pattern or the exposure surface of the photosensitive substrate based on a detection result of the interference fringe analyzer.

2. The position detecting apparatus according to claim 1, further comprising the diffracted light generating portion, wherein the diffracted light generating portion has a light-transmitting portion which is surrounded by a light-reflecting area, or a light-reflecting portion which is surrounded by a light-transmitting area.

3. The position detecting apparatus according to claim 1, further comprising the diffracted light generating portion, wherein the diffracted light generating portion has a protruding stepped portion which protrudes from a surrounding area, or a recessed stepped portion which is recessed from a surrounding area.

4. The position detecting apparatus according to claim 1, further comprising the diffracted light generating portion, wherein the diffracted light generating portion has a different-reflectance portion which has a reflectance different from that of a surrounding area.

5. The position detecting apparatus according to claim 1, further comprising a light shield which shields the photodetector from arrival of an unnecessary light generated from a surrounding of the diffracted light generating portion by receiving the detecting light.

6. The position detecting apparatus according to claim 5, wherein the light shield is arranged at a position which is optically conjugate with the photodetector.

7. The position detecting apparatus according to claim 5, wherein the light shield is rotationally symmetric.

8. The position detecting apparatus according to claim 5, wherein the light shield includes three triangular light-shields having coincident apexes.

9. The position detecting apparatus according to claim 1, wherein the reference surface is a reflecting surface, and an actuator, which moves the reflecting surface, is provided on the reflecting surface.

10. An exposure apparatus which exposes a photosensitive substrate with a predetermined pattern via a projection optical system, the exposure apparatus comprising:
    the position detecting apparatus as defined in claim 1,
    wherein the stage is operable to align the surface of the predetermined pattern or the exposure surface of the photosensitive substrate with respect to the projection optical system based on the detection result of the position detecting apparatus.

11. A position detecting method for detecting a position of an object, the position detecting method comprising:
    collecting a detecting light onto a diffracted light generating portion provided on the object;
    detecting interference fringes generated by a diffracted measuring light generated from the diffracted light generating portion by receiving the detecting light and a collimated reference light generated from a reference surface by receiving the detecting light, the reference surface being defined by a plane mirror or a corner cube prism;
    determining three-dimensional position information of the diffracted light generating portion based on the interference fringes; and
    aligning the object based on the three-dimensional position information.

12. The position detecting method according to claim 11, further comprising shielding an unnecessary light generated from a surrounding of the diffracted light generating portion by receiving the detecting light.

13. The position detecting method according to claim 11, further comprising detecting the interference fringes while changing a phase of the reference light.

14. The method of claim 11, wherein:
    the collecting the detecting light onto a diffracted light generating portion comprises collecting the detecting light onto a plurality of diffracted light generating portions provided on the object;
    the detecting interference fringes generated by a diffracted measuring light comprises detecting interference fringes generated by the diffracted measuring light generated from the plurality of diffracted light generating portions by receiving the detecting light and the collimated reference light generated from the reference surface by receiving the detecting light; and
    the determining three-dimensional position information comprises determining three-dimensional position information of the diffracted light generating portions based on the interference fringes associated with the plurality of diffracted light generating portions.

15. The method of claim 11, wherein the diffracted light generating portion is a pinhole, a point reflector, different reflectance portions, a protrusion, or a recess.

16. The method of claim 11, further comprising situating a light shield so as to be optically conjugate with the diffracted light generating portion.

17. The method of claim 16, wherein the light shield is situated so as shield about one-half of the diffracted light generating portion from the detecting light.

18. The method of claim 16, wherein the light shield is rotationally symmetric about the diffracted light generating portion.

19. The method of claim 11, further comprising:

situating a light shield at first and second positions that are optically conjugate to the diffracted light generating portion;

the detecting interference fringes generated by a diffracted measuring light comprises detecting interference fringes generated by the diffracted measuring light associated with the first and second positions; and the determining three-dimensional position information comprises determining three-dimensional position information of the diffracted light generating portion based on the interference fringes associated with the first and second positions.

20. A method for producing a device, comprising:

detecting, as a position of an object, a position of a surface of a predetermined pattern or an exposure surface of a photosensitive substrate using a position detecting method as recited in claim 11;

exposing the photosensitive substrate with the predetermined pattern; and developing the exposed photosensitive substrate.

21. A position detecting apparatus which detects a three-dimensional position of an object, the position detecting apparatus comprising:

a light source which supplies a detecting light;

light-collecting optics having at least one optical element which collects the detecting light onto a diffracted light generating portion associated with a position of a surface of a predetermined pattern or an exposure surface of a photosensitive substrate, the diffracted light generating portion including at least one hole, an uneven surface area, or a reflective surface;

a reference surface defined by a plane mirror or a corner cube prism;

light guiding optics having at least one optical element which guides, to a predetermined position, a diffracted measuring light generated from the diffracted light generating portion by receiving the detecting light and a collimated reference light generated from the reference surface by receiving the detecting light;

a photodetector which is arranged at the predetermined position and which detects interference fringes generated by the diffracted measuring light and the collimated reference light; and a stage which aligns the surface of the predetermined pattern or the exposure surface of the photosensitive substrate based on the detected interference fringes.

* * * * *